United States Patent
Bartley et al.

(10) Patent No.: US 7,050,871 B2
(45) Date of Patent: May 23, 2006

(54) METHOD AND APPARATUS FOR IMPLEMENTING SILICON WAFER CHIP CARRIER PASSIVE DEVICES

(75) Inventors: Gerald Keith Bartley, Rochester, MN (US); Darryl John Becker, Rochester, MN (US); Paul Eric Dahlen, Rochester, MN (US); Philip Raymond Germann, Oronoco, MN (US); Andrew B. Maki, Rochester, MN (US); Mark Owen Maxson, Mantorville, MN (US); John Edward Sheets, II, Zumbrota, MN (US)

(73) Assignee: International Business Machines Corporation, Armonk, NY (US)

( * ) Notice: Subject to any disclaimer, the term of this patent is extended or adjusted under 35 U.S.C. 154(b) by 155 days.

(21) Appl. No.: 10/787,478

(22) Filed: Feb. 26, 2004

(65) Prior Publication Data
US 2005/0192691 A1  Sep. 1, 2005

(51) Int. Cl.
*G06F 19/00* (2006.01)
(52) U.S. Cl. .............................. 700/97; 700/121; 716/1
(58) Field of Classification Search ................. 700/97, 700/121; 716/1
See application file for complete search history.

(56) References Cited

U.S. PATENT DOCUMENTS

| 5,307,559 | A   | 5/1994 | Long |
|-----------|-----|--------|------|
| 6,452,250 | B1  | 9/2002 | Buynoski |
| 6,511,873 | B1  | 1/2003 | Ballantine et al. |
| 6,524,905 | B1* | 2/2003 | Yamamichi et al. ........ 438/240 |
| 6,541,840 | B1  | 4/2003 | Terayama et al. |
| 6,898,769 | B1* | 5/2005 | Nassif et al. .................. 716/5 |
| 2004/0108587 | A1* | 6/2004 | Chudzik et al. ............ 257/700 |
| 2005/0108671 | A1* | 5/2005 | Becker et al. ................ 716/10 |

FOREIGN PATENT DOCUMENTS

EP    0417345    * 3/1991

* cited by examiner

*Primary Examiner*—Leo Picard
*Assistant Examiner*—Steven R. Garland
(74) *Attorney, Agent, or Firm*—Joan Pennington

(57) ABSTRACT

Methods and apparatus are provided for implementing silicon wafer chip carrier passive devices including customized silicon capacitors and resistors mounted directly on a module or carrier package. A plurality of system design inputs is received for a package arrangement. A respective physical design is generated for customized passive devices, a logic chip, and a chip carrier. Silicon devices are fabricated utilizing the generated respective physical design for customized passive devices and the logic chip and a carrier package is fabricated. The fabricated silicon devices are assembled on the carrier package.

17 Claims, 11 Drawing Sheets

METHOD AND APPARATUS FOR IMPLEMENTING SILICON WAFER CHIP CARRIER PASSIVE DEVICES

FIELD OF THE INVENTION

The present invention relates generally to semiconductor devices, and more particularly to methods and apparatus for implementing customized silicon wafer chip carrier passive devices including customized silicon capacitors and resistors mounted directly on a module or carrier package.

DESCRIPTION OF THE RELATED ART

Known advanced module packages, also called chip carriers or first level packages, typically have decoupling capacitors mounted on the package substrate around the logic chips. The conventional decoupling capacitors used today are available in a limited variety of sizes and configurations.

Disadvantages of the conventional decoupling capacitors used today are that for some assemblies only a single power supply may be decoupled per capacitor. Capacitors that accommodate multiple supply voltages typically are more expensive. Also each new combination of capacitor and package structure requires an assembly qualification. Capacitor options vary in height and size and must be selected to fit within package constraints. Various methods and arrangements are known for providing decoupling capacitors.

U.S. Pat. No. 6,511,873 to Ballantine et al., issued Jan. 28, 2003, and assigned to the present assignee, discloses methods of forming front-end-of the line (FEOL) capacitors such as polysilicon-polysilicon capacitors and metal-insulator-silicon capacitors that are capable of incorporating a high-dielectric constant (k of greater than about 8) into the capacitor structure. The disclosed methods provide high capacitance/area devices with low series resistance of the top and bottom electrodes for high frequency responses. The disclosed methods provide a significant reduction in chip size, especially in analog and mixed-signal applications where large areas of capacitance are used.

U.S. Pat. No. 6,541,840 to Terayama et al., issued Apr. 1, 2003, discloses an on-chip capacitor with a P-type silicon substrate, a bottom N-well region formed on the P-type silicon substrate, mutually adjacent first P-well and first N-well regions formed on the bottom N-well region, a first electrode formed on the first N-well region, and a second electrode formed on the first P-well region. A coupling surface is formed with the first N-well region and the first P-well region and a capacitance is formed between a power source voltage and a grounding voltage formed between the first P-well region and the bottom N-well region. Thus it is not necessary to maintain a device region, to form a capacitance, to form wiring or maintain a wiring region as in a conventional MOS capacitance while it is possible to obtain a required decoupling capacitance.

U.S. Pat. No. 5,307,559 to Long, issued May 3, 1994, discloses a capacitor that is disposed within a semiconductor device assembly atop a plastic layer pad, beneath which passes a pair of leads connected to a semiconductor device. The capacitor is connected to the pair of leads; such as, by soldering, spot welding or conductive epoxy through cutouts in the pad. In one embodiment, the cutouts extend into the pad from inner and outer edges thereof. In another embodiment, the cutouts are holes through the pad. A plurality, such as four, capacitors are conveniently disposed atop a corresponding plurality of pads, and are connected to a corresponding plurality of pairs of leads within the semiconductor device assembly. By positioning the capacitors as closely to the semiconductor device as possible, the efficacy of the capacitors is maximized.

U.S. Pat. No. 6,452,250 to Buynoski, issued Sep. 17, 2002, discloses an integrated circuit structure including a planar capacitor positioned adjacent to a logic circuit implemented on a silicon die. The silicon die is bonded to a mounting base using controlled collapse chip connection methods such that a ground terminal of the silicon die is coupled to a ground trace in the mounting base and a Vdd terminal of the silicon die is coupled to a Vdd trace in the mounting base. The capacitor includes via structures with controlled collapse chip connection structures for bonding to the mounting base directly above the silicon die and coupling a first charge accumulation plate to the Vdd trace and a second charge accumulation plate to the ground trace.

A need exists for improved methods and structures for implementing customized silicon wafer chip carrier passive devices including customized silicon capacitors and resistors mounted directly on a module or carrier package.

SUMMARY OF THE INVENTION

Principal aspects of the present invention are to provide methods and apparatus for creating customized silicon wafer chip carrier passive devices including customized silicon capacitors and resistors mounted directly on a module package. Other important aspects of the present invention are to provide such methods and apparatus for implementing silicon wafer chip carrier passive devices substantially without negative effect and that overcome many of the disadvantages of prior art arrangements.

In brief, methods and apparatus are provided for implementing silicon wafer chip carrier passive devices including customized silicon capacitors and resistors mounted directly on a module or carrier package. A plurality of system design inputs is received for a package arrangement. A respective physical design is generated for customized passive devices, a logic chip, and a chip carrier. Silicon devices are fabricated utilizing the generated respective physical design for customized passive devices and the logic chip and a carrier package is fabricated. The fabricated silicon devices are assembled on the carrier package.

In accordance with features of the invention, silicon capacitors are mounted directly onto the carrier package, eliminating conventional capacitors. The silicon chip decoupling capacitors have customized shapes, sizes, and number of connections for a particular application. The silicon chip decoupling capacitors and silicon resistors are defined from selected areas of a silicon wafer that is used for forming the logic chip.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1A:
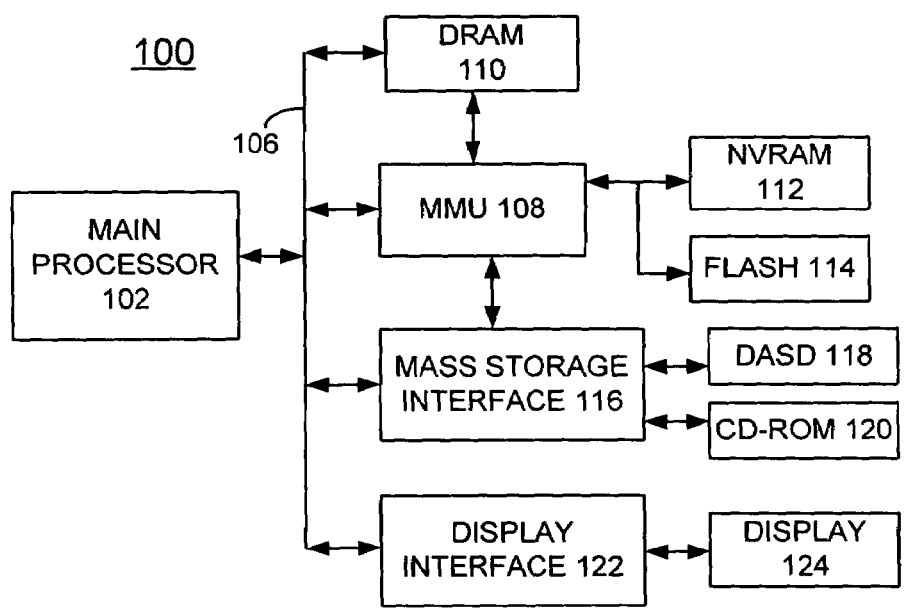
FIGS. 1A and 1B are block diagram representations illustrating a computer system and operating system for implementing methods for creating customized silicon wafer chip carrier passive devices including customized silicon capacitors and resistors mounted directly on a module package in accordance with the preferred embodiment.
Figure 1B:
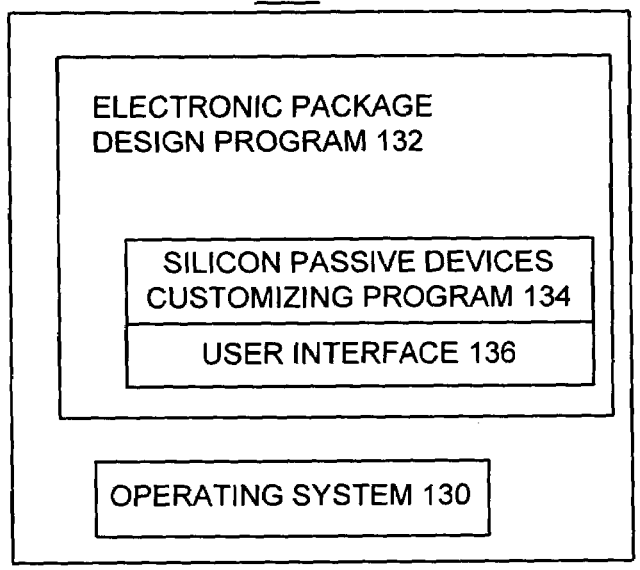

Referring now to the drawings, in FIGS. 1A and 1B there is shown a computer system generally designated by the reference character 100 for implementing methods for creating customized silicon wafer chip carrier passive devices including customized silicon capacitors and resistors mounted directly on a module package in accordance with the preferred embodiment. Computer system 100 includes a main processor 102 or central processor unit (CPU) 102 coupled by a system bus 106 to a memory management unit (MMU) 108 and system memory including a dynamic random access memory (DRAM) 110, a nonvolatile random access memory (NVRAM) 112, and a flash memory 114. A mass storage interface 116 coupled to the system bus 106 and MMU 108 connects a direct access storage device (DASD) 118 and a CD-ROM drive 120 to the main processor 102. Computer system 100 includes a display interface 122 coupled to the system bus 106 and connected to a display 124.

Computer system 100 is shown in simplified form sufficient for understanding the present invention. The illustrated computer system 100 is not intended to imply architectural or functional limitations. The present invention can be used with various hardware implementations and systems and various other internal hardware devices, for example, multiple main processors.

As shown in FIG. 1B, computer system 100 includes an operating system 130, an electronic package design program 132, a silicon passive devices customizing program 134 of the preferred embodiment, and a user interface 136.

Various commercially available computers can be used for computer system 100, for example, an IBM personal computer. CPU 102 is suitably programmed by the silicon passive devices customizing program 134 to execute the flowchart of FIG. 2 for implementing methods for creating customized silicon wafer chip carrier passive devices in accordance with the preferred embodiment.

In accordance with features of the preferred embodiment, a method is provided for creating customized silicon wafer chip carrier passive devices and mounting silicon capacitors directly on a module package. On-die capacitors are created using current silicon technology. Customized decoupling capacitors and resistors advantageously are constructed using available silicon technology and are mounted on a module package substrate near one or more logic chips.

The method of the preferred embodiment enables a package designer to create customized silicon wafer chip carrier passive devices that are capable of decoupling multiple power supply voltages, fit within an allowed or available physical space without requiring additional assembly qualification and at potentially lower costs than conventional capacitor assemblies. Customized decoupling capacitors and resistors advantageously are designed and diced from silicon wafers to meet specific requirements for a module package. The use of flip-chip mounting methods, also called C4 mounting method, for assembling chips on module packages enables assembly of decoupling capacitor chips and a logic function chip using consistent processes. A silicon chip decoupling capacitor advantageously can use the same ball pitch as the logic chip and can contain numerous ball connections and likewise numerous separate capacitors.

In accordance with features of the preferred embodiment, the method for creating customized silicon wafer chip carrier passive devices can be applied to any of multiple currently available packages for flip-chip mounted devices. This includes, for example, flip-chip plastic ball grid array (FCPBGA) and other organic carriers as well as ceramic substrates and multi-chip modules.

Figure 2:
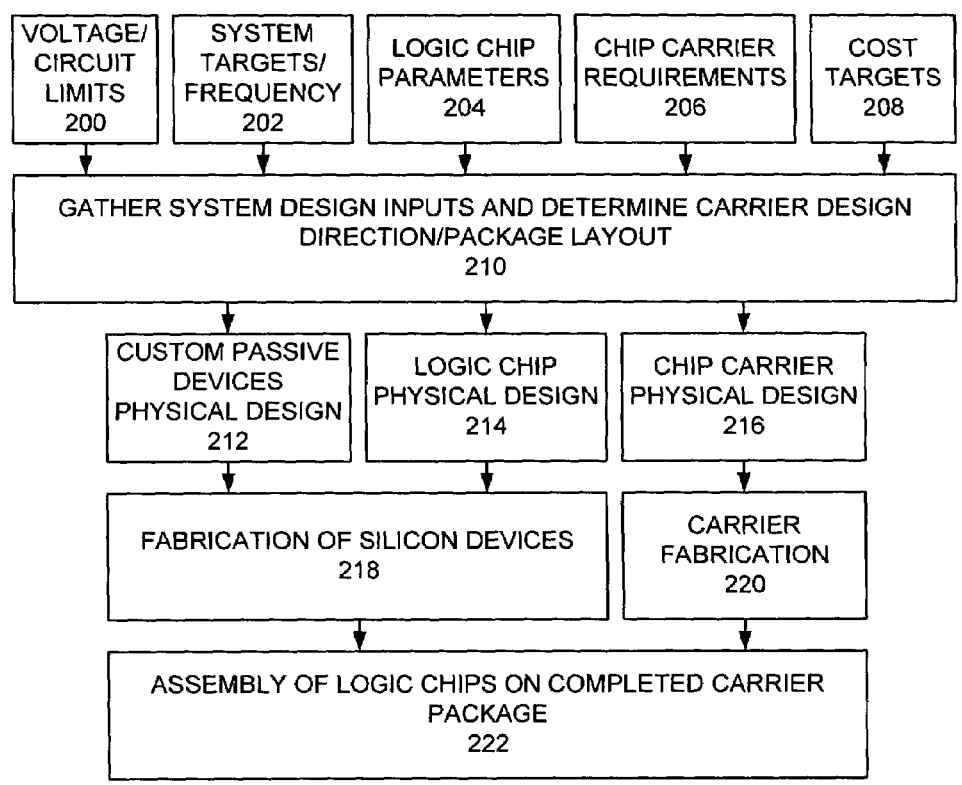
FIG. 2 is a flow chart illustrating exemplary sequential steps for creating customized silicon wafer chip carrier passive devices in accordance with the preferred embodiment.

Referring now to FIG. 2, there are shown exemplary steps for implementing methods for creating customized silicon wafer chip carrier passive devices in accordance with the preferred embodiment. Electronic and package physical design data or system design inputs for a module package arrangement are received as indicated in a plurality of blocks 200, 202, 204, 206, and 208. Received system design inputs include voltage and current limits at block 200, system targets and frequency at block 202, logic chip parameters 204, chip carrier requirements at block 206, and cost targets at block 208. The system design inputs are gathered and a carrier design direction and package layout are determined as indicated in a block 210. Physical design of custom passive devices is generated as indicated in a block 212. Logic chip physical design is generated as indicated in a block 214. Chip carrier physical design is generated as indicated in a block 216. Fabrication of the silicon devices is performed as indicated in a block 218. Fabrication of the carrier package is performed as indicated in a block 220. Assembly of the logic chips and custom passive devices on the completed carrier package is performed as indicated in a block 222.

Referring to FIGS. 3, 4, 5, 6, 7, 8, 9, and 10, there are shown multiple arrangements of customized silicon wafer chip carrier passive devices including customized silicon capacitors and resistors in accordance with the preferred embodiment.

Figure 3:
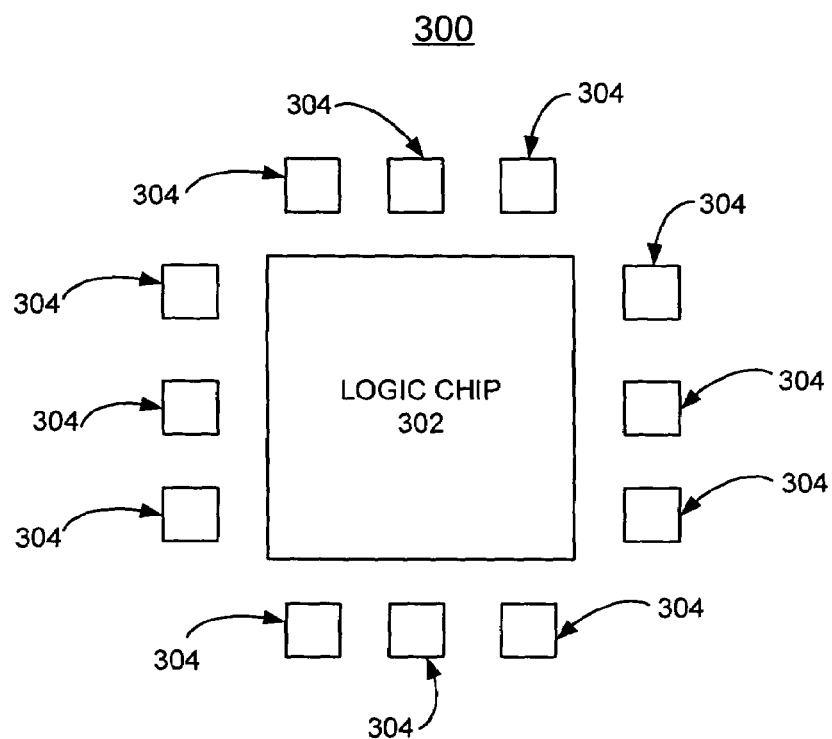
FIGS. 3, 4, 5, 6, 7, 8, 9, and 10 are diagrams illustrating multiple arrangements of customized silicon wafer chip carrier passive devices including customized silicon capacitors and resistors in accordance with the preferred embodiment.
Figure 4:
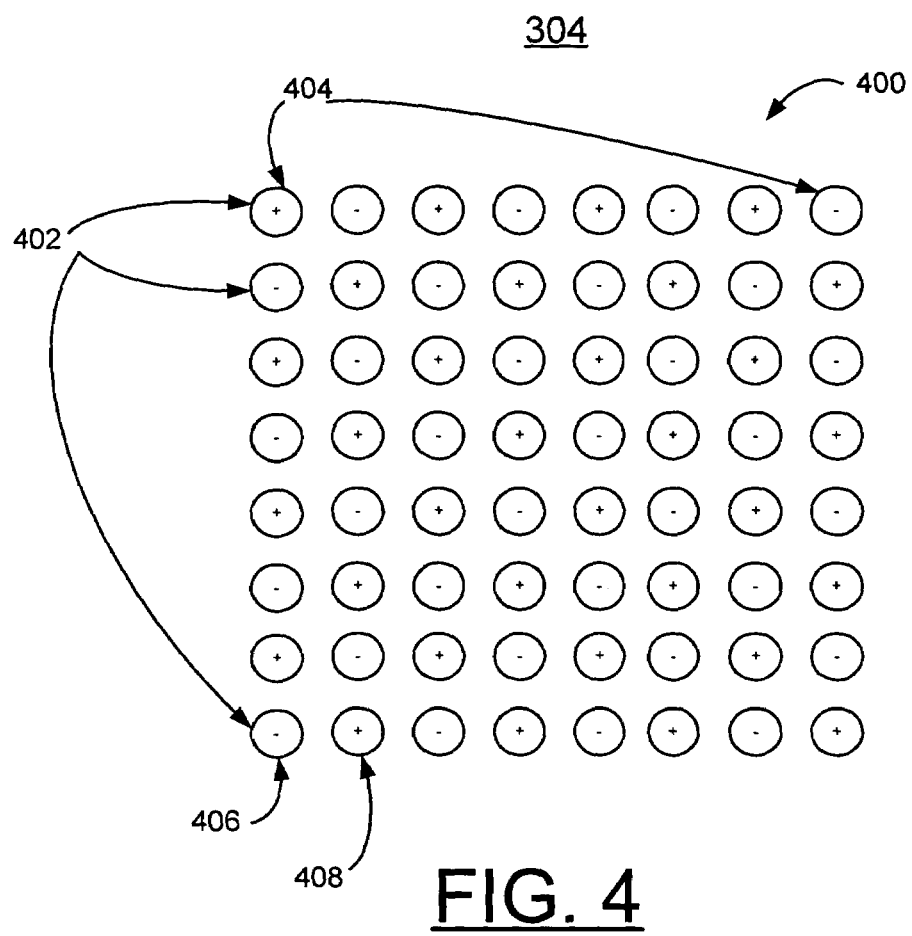

Referring now to FIGS. 3 and 4, there is shown a module package arrangement generally designated by the reference character 300 in accordance with the preferred embodiment. Module package arrangement 300 includes a logic chip 302 and a plurality of customized silicon capacitor chips 304. As shown in FIG. 4, a customized pattern on the bottom of the capacitor chip 304 contains an array 400 of a plurality of rows 402 and a plurality of columns 404 of connection pads 406, 408 for connections to numerous individual capacitors.

Figure 5:
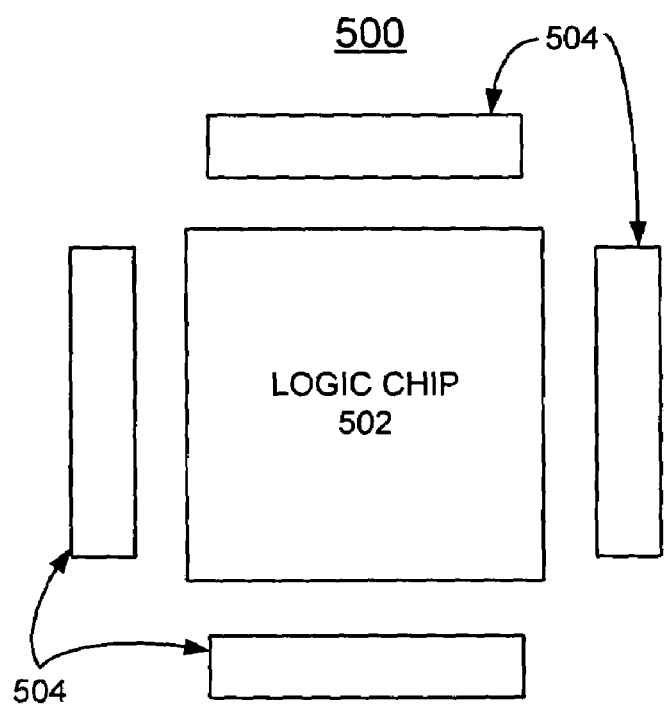

Referring now to FIG. 5, there is shown another module package arrangement generally designated by the reference character 500 in accordance with the preferred embodiment. Module package arrangement 500 includes a logic chip 502 and a plurality of customized silicon capacitor chips 504. The customized silicon capacitor chips 504 of the module package arrangement 500 illustrate exemplary on-module capacitors that are substantially the same length as the silicon logic chip 502.

Figure 6:
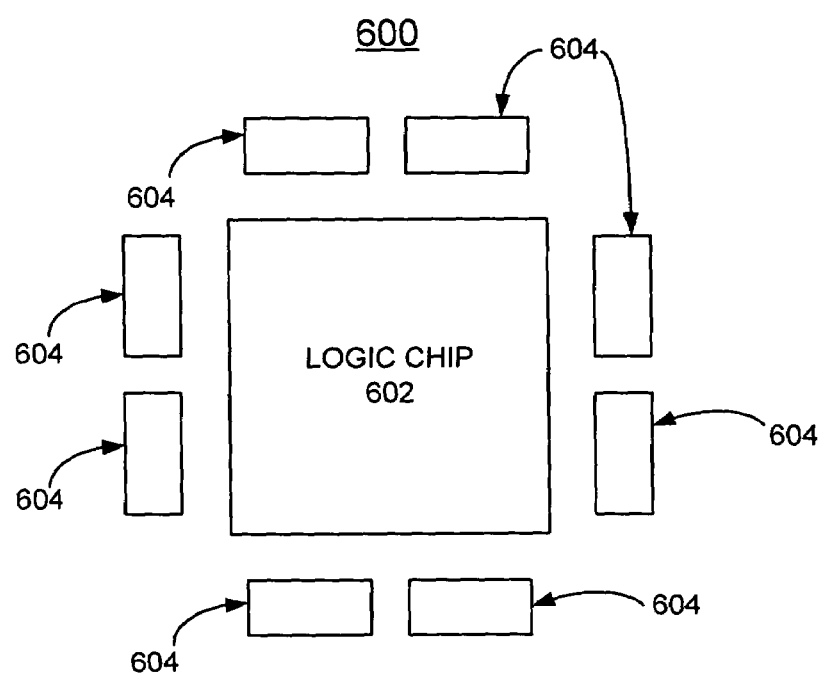

Referring now to FIG. 6, there is shown another module package arrangement generally designated by the reference character 600 in accordance with the preferred embodiment. Module package arrangement 600 includes a logic chip 602 and a plurality of customized silicon capacitor chips 604. The customized silicon capacitor chips 604 of the module package arrangement 600 illustrate an exemplary customized variation of sizes or a number of on-module capacitors that could be standardized with selected customization provided in the design of the module package.

Figure 7:
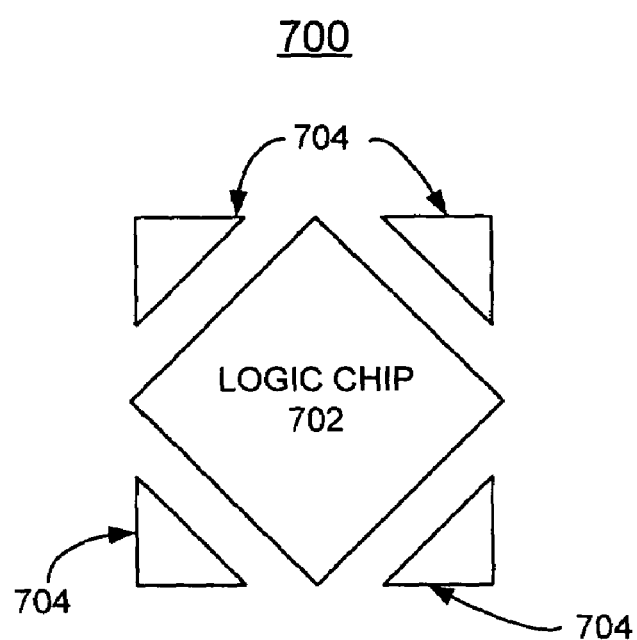

Referring now to FIG. 7, there is shown another module package arrangement generally designated by the reference character 700 in accordance with the preferred embodiment. Module package arrangement 700 includes a logic chip 702 and a plurality of customized silicon capacitor chips 704. The customized silicon capacitor chips 704 of the module package arrangement 700 illustrate exemplary triangular shaped on-module capacitors that could be provided, for example, when space is limited.

Figure 8:
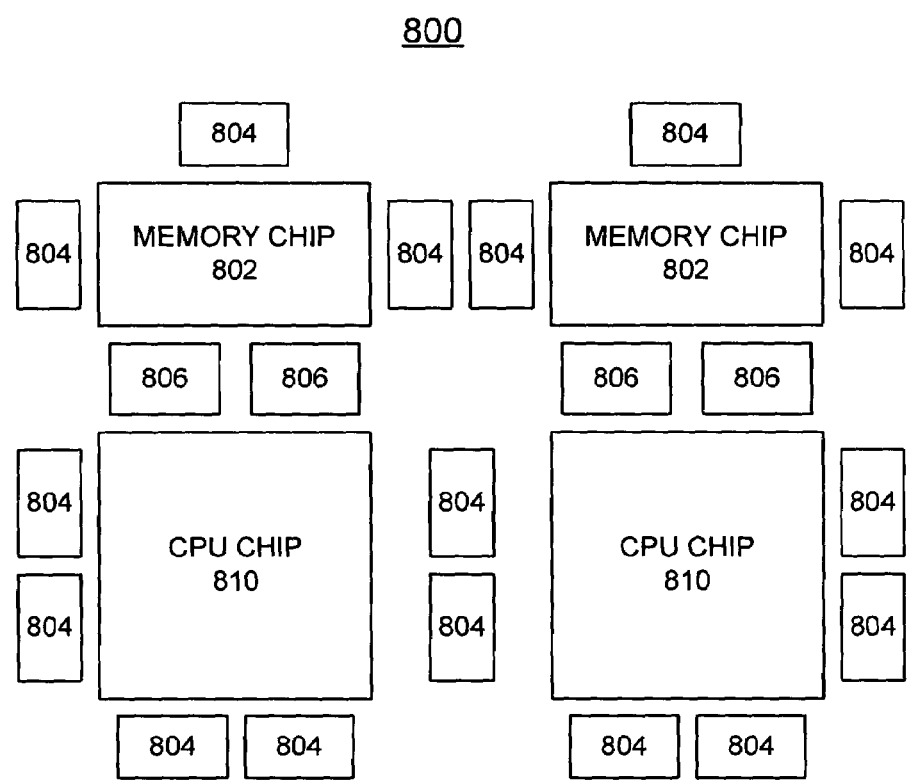

Referring now to FIG. 8, there is shown another module package arrangement generally designated by the reference character 800 in accordance with the preferred embodiment. Module package arrangement 800 includes a plurality of memory chips 802, a plurality of customized silicon capacitor chips 804, a plurality of customized silicon resistor 806, and a plurality of central processing unit (CPU) chips 810. The customized module package arrangement 800 illustrates a multi-chip module with exemplary on-module resistors 806 and capacitors 804 that could be provided for a particular application.

Figure 9:
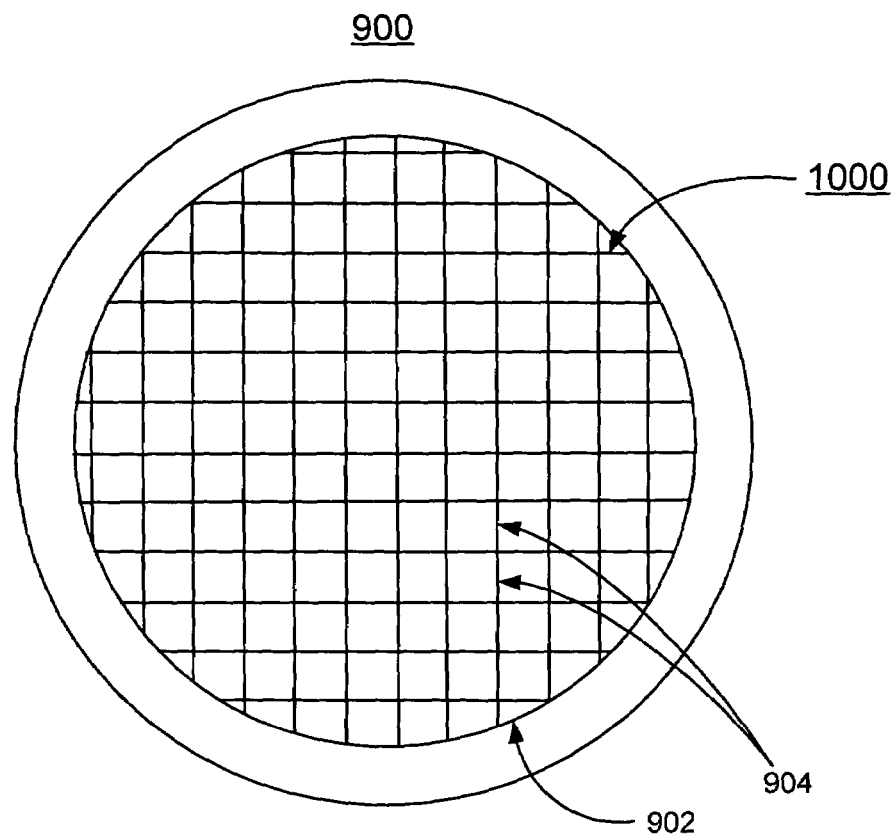
Figure 10:
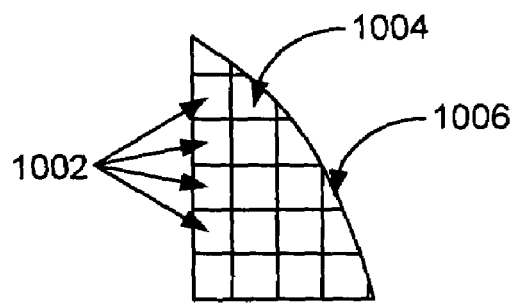

Referring now to FIGS. 9 and 10, there is shown a silicon wafer arrangement generally designated by the reference character 900 in accordance with the preferred embodiment. The silicon wafer 900 has a generally circular configuration 902 and includes a plurality of interior rectangular areas 904 for implementing logic chips and an exemplary peripheral area 190 that is generally unusable for larger logic chips. As shown in FIG. 10, the exemplary peripheral area 1000 advantageously is used to obtain silicon passive devices by further dicing including rectangular areas 1002, and a plurality of other shaped areas 1004, 1006. As shown in FIG. 10, the otherwise unusable exemplary peripheral area 1000 remaining after the larger rectangular chips are diced out of the round wafer 1002, allows the silicon passive devices to be obtained for very little cost. The use of the otherwise scrap wafer area, such as the exemplary peripheral area 1000, enables producing silicon capacitors and silicon resistors at essentially no additional cost. The silicon capacitors and silicon resistors are diced after all of the logic chips have been picked from the wafer. This allows unusual shapes, such as the triangular capacitors 704 of FIG. 7, to accommodate unique custom requirements of a particular module package arrangement to be obtained for very little cost.

It should be understood that silicon passive devices could be provided utilizing a scribe line or kerf areas between functional logic chip die. Capacitor scribe line structures are built for necessary inline quality measurements and could be utilized for producing silicon capacitors and silicon resistors in accordance with the preferred embodiment.

The desired capacitor and resistor structures can be defined on the product reticle by tiling the periphery on all sides around the die and kerf structures with these passive components, then simply shuttering off the exposure of these components when these components would interfere with neighboring die, that is on all four sides when in the interior of the wafer 1000 and only on two or three sides when neighboring die are not present on one or two of the sides of the die field being exposed at that wafer location.

It should be understood that the present invention is not limited to the illustrated rectangular and triangular shapes for the silicon capacitors of the preferred embodiment. Various other customized shapes advantageously are provided for the silicon capacitors of the preferred embodiment as desired for a particular application.

Figure 11:
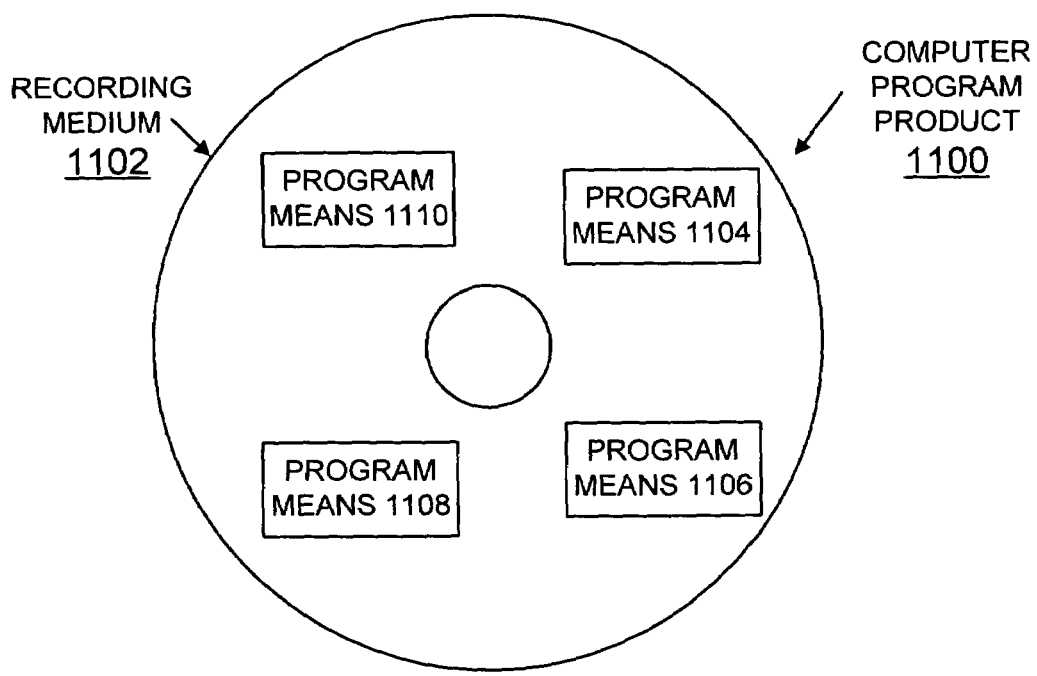
FIG. 11 is a block diagram illustrating a computer program product in accordance with the preferred embodiment.

Referring now to FIG. 11, an article of manufacture or a computer program product 1100 of the invention is illustrated. The computer program product 1100 includes a recording medium 1102, such as, a floppy disk, a high capacity read only memory in the form of an optically read compact disk or CD-ROM, a tape, a transmission type media such as a digital or analog communications link, or a similar computer program product. Recording medium 1102 stores program means 1104, 1106, 1108, 1110 on the medium 1102 for carrying out methods for implementing customized silicon wafer chip carrier passive devices of the preferred embodiment in the system 100 of FIGS. 1A and 1B.

A sequence of program instructions or a logical assembly of one or more interrelated modules defined by the recorded program means 1104, 1106, 1108, 1110, direct the computer system 100 for creating customized silicon wafer chip carrier passive devices of the preferred embodiment.

While the present invention has been described with reference to the details of the embodiments of the invention shown in the drawing, these details are not intended to limit the scope of the invention as claimed in the appended claims.

What is claimed is:

1. A method for implementing customized silicon wafer chip carrier passive devices comprising the steps of:
    receiving system design inputs for a package arrangement;
    generating a respective physical design for customized passive devices, a logic chip, and a chip carrier;
    fabricating silicon devices utilizing the generated respective physical design for customized passive devices and the logic chip including the steps of dicing silicon chip decoupling capacitors from a peripheral area of a silicon wafer;
    fabricating a carrier package; and
    assembling the fabricated silicon devices on the carrier package.

2. A method as recited in claim 1 wherein the step of assembling the fabricated silicon devices on the carrier package includes the steps of mounting silicon capacitors directly onto the carrier package.

3. A method as recited in claim 1 wherein the step of assembling the fabricated silicon devices on the carrier package includes the steps of mounting silicon resistors directly onto the carrier package.

4. A method as recited in claim 1 wherein the step of assembling the fabricated silicon devices on the carrier package includes the steps of using flip-chip mounting methods for assembling silicon chips onto the carrier package.

5. A method as recited in claim 1 wherein the step of generating a respective physical design for customized passive devices, a logic chip, and a chip carrier includes the steps of generating a physical design for a silicon capacitor chip having a selected capacitor shape.

6. A method as recited in claim 1 wherein the step of generating a respective physical design for customized passive devices, a logic chip, and a chip carrier includes the steps of generating a physical design for a silicon capacitor chip having a selected capacitor size.

7. A method as recited in claim 1 wherein the step of generating a respective physical design for customized passive devices, a logic chip, and a chip carrier includes the steps of generating a physical design for a silicon capacitor chip having a selected number of capacitor connections.

8. A method as recited in claim 1 wherein the step of receiving system design inputs for a package arrangement includes the steps of receiving voltage and current limits.

9. A method as recited in claim 1 wherein the step of receiving system design inputs for a package arrangement includes the steps of receiving system targets and a frequency specification.

10. A method as recited in claim 1 wherein the step of receiving system design inputs for a package arrangement includes the steps of receiving logic chip parameters.

11. A method as recited in claim 1 wherein the step of receiving system design inputs for a package arrangement includes the steps of receiving chip carrier package specifications.

12. A method as recited in claim 1 wherein the step of receiving system design inputs for a package arrangement includes the steps of receiving cost target specifications.

13. A method as recited in claim 1 wherein the step of fabricating silicon devices utilizing the generated respective physical design for customized passive devices and the logic chip includes the steps of defining silicon chip decoupling capacitors and silicon resistors from selected areas of a silicon wafer used for forming the logic chip.

14. Apparatus for implementing customized silicon wafer chip carrier passive devices on a carrier package arrangement comprising:
    a silicon passive devices customizing program for receiving system design inputs for a carrier package arrangement;
    said silicon passive devices customizing program for generating a respective physical design for customized passive devices, a logic chip, and a chip carrier; for fabricating silicon devices utilizing the generated respective physical design for customized passive devices and the logic chip including dicing silicon chip decoupling capacitors from a peripheral area of a silicon wafer and for fabricating a carrier package; and
    said silicon passive devices customizing program for assembling the fabricated silicon devices onto the carrier package.

15. Apparatus for implementing customized silicon wafer chip carrier passive devices as recited in claim 14 wherein the system design inputs include at least one of voltage and current limits; system targets and a frequency specification; logic chip parameters; chip carrier package specifications; and cost target specifications.

16. Apparatus for implementing customized silicon wafer chip carrier passive devices as recited in claim 14 wherein said silicon passive devices customizing program for assembling the fabricated silicon devices onto the carrier package includes said silicon passive devices customizing program for assembling the fabricated silicon capacitors directly onto the carrier package.

17. Apparatus for implementing customized silicon wafer chip carrier passive devices as recited in claim 14 wherein said silicon passive devices customizing program for generating a respective physical design for customized passive devices includes said silicon passive devices customizing program for generating a physical design for a silicon capacitor chip having a selected capacitor shape; a selected capacitor size; and a selected number of capacitor connectors.

* * * * *